(12) United States Patent
Konrath et al.

(10) Patent No.: US 9,711,660 B2
(45) Date of Patent: Jul. 18, 2017

(54) JFET AND METHOD OF MANUFACTURING THEREOF

(71) Applicant: Infineon Technologies AG, Neubiberg (DE)

(72) Inventors: Jens Peter Konrath, Villach (AT); Hans-Joachim Schulze, Taufkirchen (DE); Ralf Siemieniec, Villach (AT); Cedric Ouvrard, Villach (AT)

(73) Assignee: Infineon Technologies AG, Neubiberg (DE)

( * ) Notice: Subject to any disclaimer, the term of this patent is extended or adjusted under 35 U.S.C. 154(b) by 231 days.

(21) Appl. No.: 14/207,733

(22) Filed: Mar. 13, 2014

(65) Prior Publication Data

US 2015/0263178 A1 Sep. 17, 2015

(51) Int. Cl.
| | |
|---|---|
| *H01L 29/808* | (2006.01) |
| *H01L 29/66* | (2006.01) |
| *H01L 21/266* | (2006.01) |
| *H01L 29/10* | (2006.01) |
| *H01L 29/16* | (2006.01) |
| *H01L 29/36* | (2006.01) |
| *H01L 29/40* | (2006.01) |

(52) U.S. Cl.
CPC ........ *H01L 29/8083* (2013.01); *H01L 21/266* (2013.01); *H01L 29/1066* (2013.01); *H01L 29/1608* (2013.01); *H01L 29/66909* (2013.01); *H01L 29/36* (2013.01); *H01L 29/407* (2013.01)

(58) Field of Classification Search
CPC ........... H01L 29/8083; H01L 29/66893; H01L 29/66909; H01L 29/1066; H01L 29/1608
USPC .......................................................... 257/263
See application file for complete search history.

(56) References Cited

U.S. PATENT DOCUMENTS

| | | | | |
|---|---|---|---|---|
| 6,600,192 B1 * | 7/2003 | Sugawara | ........... | H01L 29/1066 257/329 |
| 9,209,318 B2 * | 12/2015 | Esteve | ............ | H01L 29/66909 |

(Continued)

OTHER PUBLICATIONS

Kelley et al, "1700 V Enhancement-mode SiC VJFET for High Voltage Auxiliary Flyback SMPS," ISBN 978-3-8007-3229-6 VDE Verlag GMBH, May 6, 2010, pp. 304-308, Berlin.

(Continued)

*Primary Examiner* — Mark Prenty
(74) *Attorney, Agent, or Firm* — Murphy, Bilak & Homiller, PLLC

(57) ABSTRACT

A JFET has a semiconductor body with a first surface and second surface substantially parallel to the first surface. A source metallization and gate metallization are arranged on the first surface. A drain metallization is arranged on the second surface. In a sectional plane substantially perpendicular to the first surface, the semiconductor body includes: a first semiconductor region in ohmic contact with the source and drain metallizations, at least two second semiconductor regions in ohmic contact with the gate metallization, spaced apart from one another, and forming respective first pn-junctions with the first semiconductor region, and at least one body region forming a second pn-junction with the first semiconductor region. The at least one body region is in ohmic contact with the source metallization. At least a portion of the at least one body region is, in a projection onto the first surface, arranged between the two second semiconductor regions.

14 Claims, 10 Drawing Sheets

(56) References Cited

U.S. PATENT DOCUMENTS

| | | | | |
|---|---|---|---|---|
| 9,230,956 B2* | 1/2016 | Ma | ................... | H01L 29/66909 |
| 2005/0173726 A1* | 8/2005 | Potts | ................... | H01L 29/8083 |
| | | | | 257/134 |
| 2007/0252178 A1* | 11/2007 | Onose | ................ | H01L 29/0692 |
| | | | | 257/270 |
| 2014/0284623 A1* | 9/2014 | Ota | ................... | H01L 29/1608 |
| | | | | 257/77 |
| 2014/0346528 A1* | 11/2014 | Hisada | ............... | H01L 29/1608 |
| | | | | 257/77 |
| 2015/0061089 A1* | 3/2015 | Siemieniec | ........ | H01L 29/8083 |
| | | | | 257/654 |
| 2015/0076568 A1* | 3/2015 | Siemieniec | ........ | H01L 29/8083 |
| | | | | 257/263 |

OTHER PUBLICATIONS

Treu et al, "Strategic Considerations for Unipolar SiC Switch Options: JFET vs. MOSFET," IEEE, 2007, pp. 1-7.

* cited by examiner

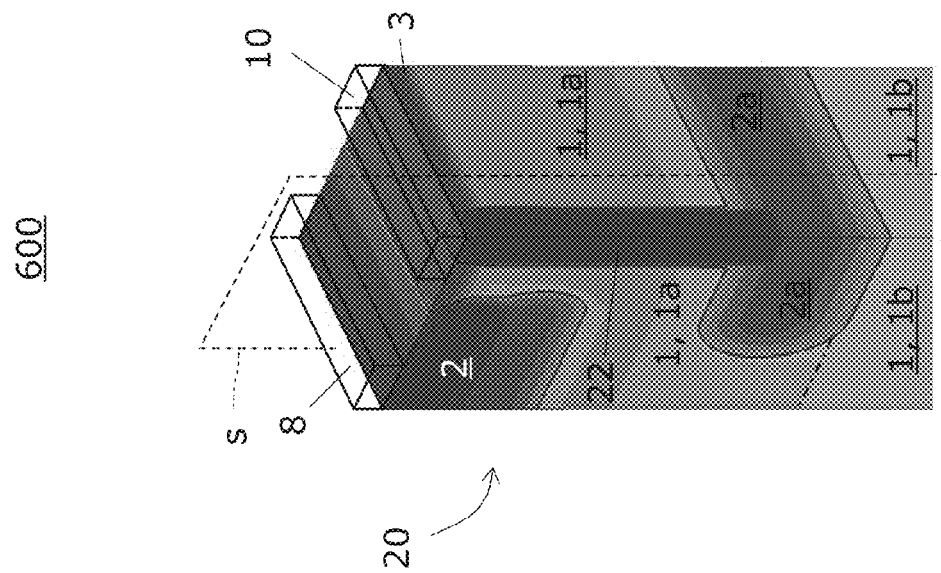
FIG 7B
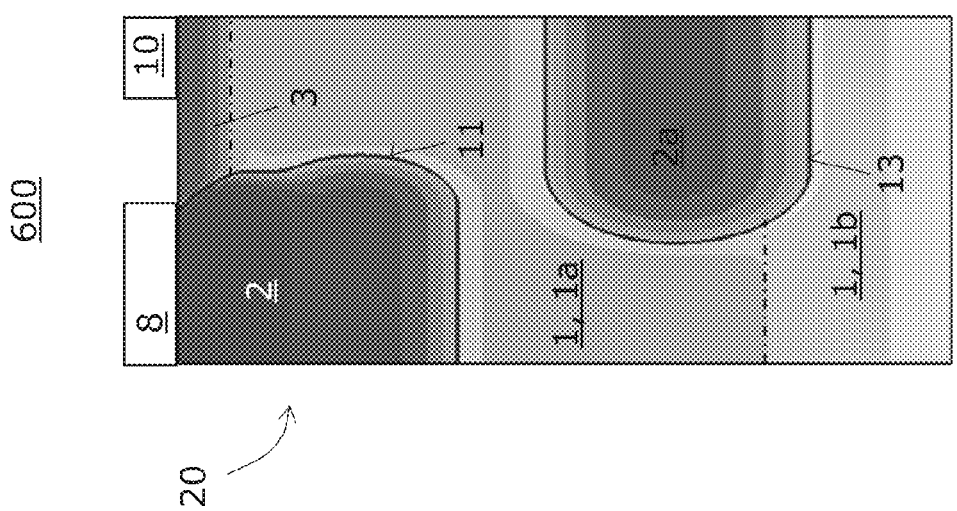
FIG 7A

JFET AND METHOD OF MANUFACTURING THEREOF

TECHNICAL FIELD

Embodiments of the present invention relate to JFETs, in particular to vertical JFETs, and to related methods for producing vertical semiconductor devices.

BACKGROUND

Junction gate field-effect transistors (JFETs, sometimes also referred to as JUGFETs) are widely used as electronically controlled switching structures in wide band-gap semiconductor devices such as silicon carbide (SiC) semiconductor devices. In JFETs a substantially unipolar current flows between a source metallization (source terminal) and a drain metallization (drain terminal) through a semiconducting channel (channel region) controlled by applying an appropriate voltage to a gate metallization (gate terminal) in contact with a gate region forming a pn-junction with the channel. In normally-on JFETs, the channel is "pinched off" by applying a reverse bias voltage to a gate metallization, i.e. a voltage reversely biasing the pn-junction, which is higher than the pinch-off voltage of the JFET.

In lateral JFETs having a lateral channel, the channel is typically defined during manufacturing by a high temperature epitaxial deposition. Using this sophisticated process, the manufactured channel width is mainly determined by the thickness of the epitaxially deposited layer. Typically, a narrow process window is used for the epitaxial deposition to reduce the variability of the pinch-off voltage resulting from the thickness variability. However, this may result in a low yield. The variability of channel width and pinch-off voltage, respectively, of vertical JFETs is mainly determined by lithography variations, in particular CD-variations (critical dimension variations). This typically also results in a trade-off between processing yield and variability of the pinch-off voltage.

For these and other reasons, improvements are needed.

SUMMARY

According to an embodiment of a vertical JFET, the vertical JFET includes a semiconductor body having a first surface and a second surface which runs substantially parallel to the first surface. A source metallization and a gate metallization are arranged on the first surface. A drain metallization is arranged on the second surface. In a sectional plane substantially perpendicular to the first surface, the semiconductor body includes: an n-doped first semiconductor region in ohmic contact with the drain metallization and the source metallization, a plurality of p-doped second semiconductor regions in ohmic contact with the gate metallization, substantially extending to the first surface, spaced apart from one another and forming respective first pn-junctions with the first semiconductor region, and a plurality of p-doped body regions spaced apart from one another, from the p-doped second semiconductor regions, from the first surface and from the second surface, and forming respective second pn-junctions with the first semiconductor region. The p-doped body regions are in ohmic contact with the source metallization.

According to an embodiment of a JFET, the JFET includes a semiconductor body having a first surface and a second surface which runs substantially parallel to the first surface. A source metallization and a gate metallization are arranged on the first surface. A drain metallization is arranged on the second surface. In a sectional plane substantially perpendicular to the first surface, the semiconductor body includes: a first semiconductor region in ohmic contact with the source metallization and the drain metallization, at least two second semiconductor regions in ohmic contact with the gate metallization, spaced apart from one another, and forming respective first pn-junctions with the first semiconductor region, and at least one body region forming a second pn-junction with the first semiconductor region. The at least one body region is in ohmic contact with the source metallization. At least a portion of the at least one body region is, in a projection onto the first surface, arranged between the two second semiconductor regions.

According to an embodiment of a method for producing a JFET, the method includes: providing a semiconductor substrate having a first surface and an n-doped first semiconductor layer; forming on the first surface a hard mask, which includes openings defining first zones in the n-doped first semiconductor layer; implanting acceptor ions of a first maximum energy through the hard mask into the first zones; replacing the hard mask by an inverted mask which includes openings which are substantially complementary to the openings of the hard mask; implanting acceptor ions of a second maximum energy different than the first maximum energy through the inverted mask into second zones of the n-doped first semiconductor layer; carrying out at least one temperature step to activate the acceptor ions in the first zones and the second zones; forming on the first surface a gate metallization in ohmic contact with the second zones; and forming on the first surface a source metallization in ohmic contact with the first zones.

According to an embodiment of a method for producing a JFET, the method includes: providing a semiconductor substrate having a first side and comprising an n-doped first semiconductor layer extending to the first side; forming a mask on the first side so that the mask comprises in a sectional plane mask portions and openings arranged between adjacent mask portions; implanting acceptor ions through the mask into the first semiconductor layer, the acceptor ions having a first maximum energy so that at least a portion of the acceptor ions impacting on the mask portions penetrate through the mask portions and are implanted into the first semiconductor layer; removing the mask; and implanting donor ions from the first side into the first semiconductor layer.

Those skilled in the art will recognize additional features and advantages upon reading the following detailed description, and upon viewing the accompanying drawings.

BRIEF DESCRIPTION OF THE DRAWINGS

The components in the Figures are not necessarily to scale, instead emphasis is placed upon the principles illustrated therein.

FIG. 7A illustrates a cross-section through a semiconductor body of a vertical semiconductor device according to an embodiment.

FIG. 7B illustrates a perspective view of a part of a vertical semiconductor device according to an embodiment.

DETAILED DESCRIPTION

Figure 1:
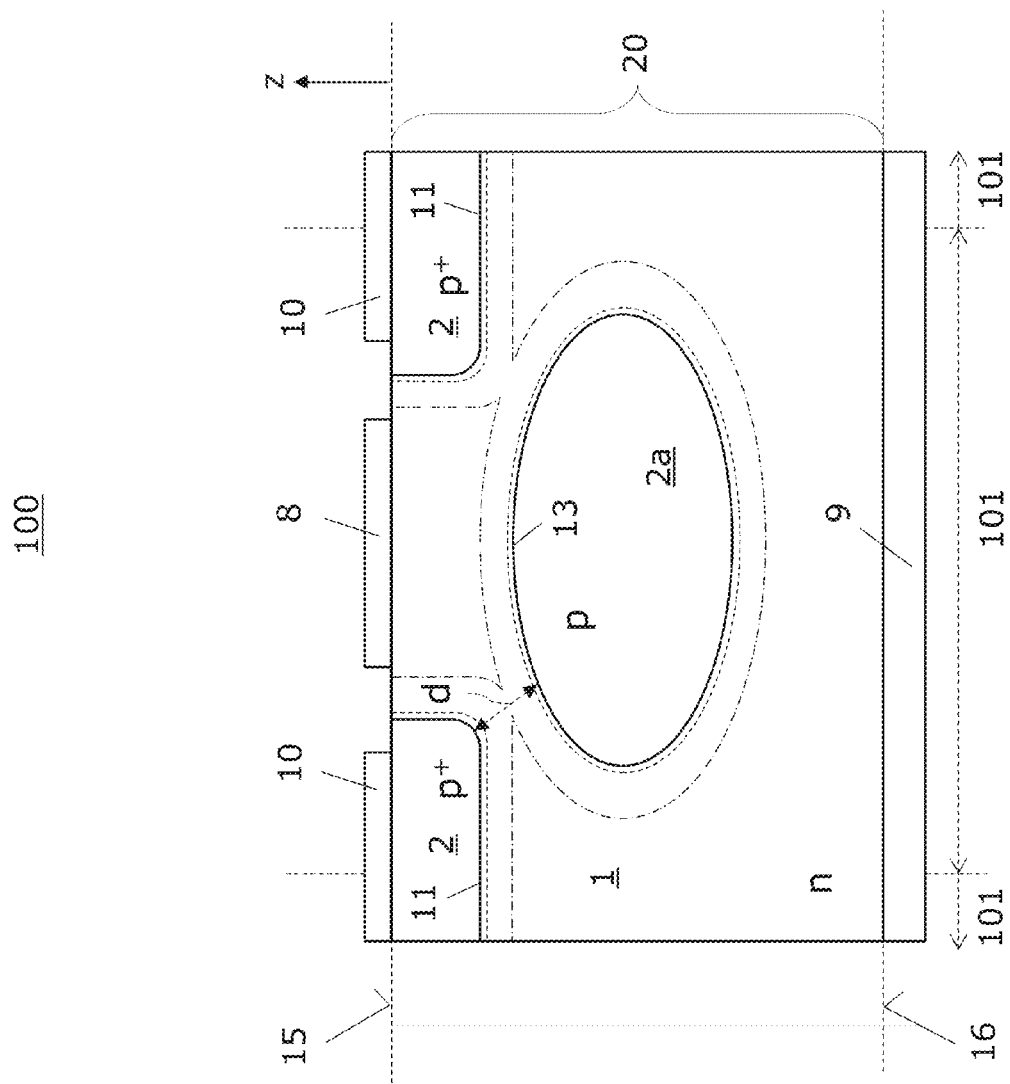
FIG. 1 illustrates a cross-section through a semiconductor body of a vertical semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. Other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation that is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "$n^-$" means a doping concentration that is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, unipolar semiconductor devices such as n-channel JFETs and p-channel JFETs, in particular to vertical JFETs, and to manufacturing methods therefor.

In the context of the present specification, the terms "substantially unipolar semiconductor device" and "unipolar semiconductor device" intend to describe a semiconductor device with a load current at a rated current density and lower current densities that is unipolar or at least substantially unipolar.

Typically, the semiconductor device is a power semiconductor device having an active area with a plurality of diode-cells for rectifying a load current between two load metallization. Furthermore, the power semiconductor device may have a peripheral area with at least one edge-termination structure at least partially surrounding an active area of diode-cells when seen from above.

The term "power semiconductor device" as used in this specification intends to describe a semiconductor device on a single chip with high voltage and/or high current switching capabilities. In other words, power semiconductor devices are intended for high current, typically in the range of one or more Amperes and/or high voltages, typically above 100 V, more typically above 400 V.

In the context of the present specification, the terms "in ohmic contact," in resistive electric contact" and "in resistive electric connection" intend to describe that there is an ohmic current path between respective elements or portions of a semiconductor device at least when no voltages or only low testing voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously. In some embodiments, the resistivity of a low resistive current path between respective elements or portions of a semiconductor device which is low when low voltages are applied to and/or across the semiconductor device, for example a probe voltage of less than one or a few volts, becomes high above a threshold voltage, for example due to depleting a semiconductor region forming at least a part of the current path.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu, and Mo, or a metal alloy such as NiAl, but may also be made of a material with metallic or near metallic properties with respect to electric conductivity such as highly doped n-type or p-type poly-Si, TiN, an electrically conductive silicide such as $TaSi_2$, $TiSi_2$, PtSi, $WSi_2$, MoSi, or an electrically conductive carbide such as AlC, NiC, MoC, TiC, PtC, WC or the like. The metallization may also include different electrically conductive materials, for example a stack of those materials.

In the context of the present specification, the term "depletable region" or "depletable zone" is intended to describe the fact that the corresponding semiconductor region or the corresponding semiconductor zone is substantially fully depleted (substantially free of free charge carriers) during the off state of the semiconductor component with an applied reverse voltage lying above a given threshold value. For this purpose, the doping charge of the depletable region is set accordingly and, in one or more embodiments, the depletable region is a weakly doped region. In the off state, the depletable region(s) form depleted region(s), also referred to as space charge region(s), typically a contiguous depleted zone, whereby the current flow between two electrodes or metallizations connected to the semiconductor body can be prevented.

In the following, embodiments pertaining to semiconductor devices and manufacturing methods for forming semiconductor devices are explained mainly with reference to silicon carbide (SiC) semiconductor devices having a monocrystalline SiC semiconductor body. Accordingly, a semiconductor region or layer is typically a monocrystalline SiC-region or SiC-layer if not stated otherwise. However, the semiconductor body can be made of any semiconductor material suitable for manufacturing a semiconductor device. Examples of such materials include, without being limited thereto, elementary semiconductor materials such as silicon (Si), diamond (C), or germanium (Ge), group IV compound semiconductor materials such as silicon carbide (SiC), lead sulphide (PbS) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe). The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)— aluminum gallium nitride (AlGaN), silicon-silicon carbide ($Si_xC_{1-x}$) and silicon-SiGe heterojunction semiconductor materials. For power semiconductor applications, mainly Si, SiC, GaAs and GaN materials are used. If the semiconductor body is made of a wide band-gap material, i.e. of a semiconductor material with a band-gap of at least about two electron volts such as SiC or GaN and having a high breakdown field strength and high critical avalanche field strength, respectively, the doping of the respective semiconductor regions can be chosen higher which reduces the on-state resistance $R_{on}$.

FIG. 1 shows, in a vertical cross-section, a first embodiment of a vertical semiconductor device 100 having a semiconductor body 20. The direction of the normal to a first surface 15 of the semiconductor body 20 defines a vertical direction z. On the first surface 15 a source metallization 8 or source electrode 8 and a gate metallization 10 or gate electrode 10 are arranged. Typically, the two separate portions of the gate electrode 10 illustrated in FIG. 1 are portions of a contiguous metallization when seen from above and in a projection onto the first surface 15, respectively. Different thereto, the source metallization 8 and the gate metallization 10 are not formed by a common metallization but also spaced apart from each other when seen from above and in a projection onto the first surface 15, respectively. On a second surface 16 opposite to the first surface 15 a drain metallization 9 or drain electrode 9 is arranged, typically over the whole active area. Accordingly, the semiconductor device 100 is a three-terminal semiconductor device.

The semiconductor body 20 contains an n-doped first semiconductor region or semiconductor layer 1 that is typically in ohmic contact with the source metallization 8 and the drain metallization 9.

In the exemplary embodiment shown in FIG. 1, two p-doped second semiconductor regions 2 are partly embedded in the first semiconductor region 1 and in ohmic contact with the gate metallization 10. Accordingly, a resistance of a substantially unipolar current (electron current in the exemplary embodiment) may be controlled by the voltage difference applied between the source metallization 8 and the gate metallization 10. Accordingly, the semiconductor device 100 may be operated as a JFET (n-channel JFET in the exemplary embodiment). In the following, the first semiconductor region 1 and the second semiconductor regions 2 are also referred to as channel and drift region 1 and gate regions 2, respectively.

The gate regions 2 typically extend to the first surface 15 and are, in the vertical cross-section, spaced apart from one another and form respective first pn-junctions 11 with the first semiconductor region 1. Typically, the first pn-junctions 11 extend to the first surface 15.

To form an ohmic contact between the gate regions 2 and the gate metallization 10, a sufficiently high doping of the gate regions 2, e.g. a maximum doping concentration of typically at least about $5*10^{18}/cm^3$, may be selected at least at the gate metallization 10. Alternatively, a sufficiently highly p-doped additional contact portion (not shown) may be arranged between each of the two gate regions 2 and the gate metallization 10. In the exemplary embodiment in FIG. 1, the gate regions 2 are $p^+$-doped and directly adjoin the gate metallization 10.

Likewise, the doping of the first semiconductor region 1 is typically sufficiently high in n-type contact portions (not shown) of the first semiconductor region 1 adjoining the source metallization 8 and the drain metallization 9, respectively.

In the exemplary embodiment shown in FIG. 1, a p-doped body region 2a is completely embedded in the first semiconductor region 1, spaced apart from the gate regions 2, from the first surface 15 and from the second surface 16, and forms a closed second pn-junction 13 with the first semiconductor region 1.

To avoid high field strength in the off-state, the first pn-junctions 11 and the second pn-junctions 13 have typically no sharp edges.

Although the body regions 2a is spaced apart from the first surface 15 and the source metallization 8, respectively, the body regions 2a are typically in ohmic contact with the source metallization 8 and thus forms an integrated body region of the JFET 100.

JFET 100 is typically a power JFET having in its active area a plurality of unit cells 101. In this embodiment, the body regions 2a of adjacent unit cells 101 are also spaced apart from each other by the first semiconductor region 1.

Note that FIG. 1 typically corresponds to a small section of the active area of a power JFET 100 having a plurality of gate regions 2 and a plurality of body regions 2a that are arranged vertically below the gate regions 2 and horizontally offset to the gate regions 2. In this embodiment, the plurality of gate regions 2 typically form a first lattice or first grid and the plurality of body regions 2a typically form a horizontally off-set second lattice or second grid with substantially the same lattice constant.

The first and second grids can be one-dimensional grids of strip-shaped gate regions 2 and bar-shaped body regions 2a, respectively, when seen from above. Alternatively, the gate regions 2 and the body regions 2a may be substantially ring-shaped when seen from above. The gate regions 2 and the body regions 2a may also be shaped as polygons, circles or ellipsoids when seen from above.

Typically, the body region 2a is, in a horizontal direction and when seen from above, respectively, substantially centered between adjacent gate regions 2. Accordingly, a substantially mirror-symmetric JFET-cell 101 may be provided ensuring a symmetric current distribution during device operation.

The body region 2a may or may not partly overlap with the two adjacent gate regions 2 when seen from above.

In the exemplary embodiment of an n-channel JET shown in FIG. 1, the body region 2a is p-doped semiconductor region. The maximum doping concentration of the body region(s) 2a may be substantially equal to or more typically smaller than the maximum doping concentration of the gate regions 2.

Depending on doping relations and geometry, in particular the minimum channel width d and spacing between adjacent gate and body regions 2, 2a, respectively, the JFET 100 may be implemented as a normally-on JFET or a normally-off JFET. For example, at a typical doping concentration of about some $10^{14}$ cm$^{-3}$ to about some $10^{17}$ cm$^{-3}$ of the first semiconductor region 1 between adjacent gate and body regions 2, 2a, a normally-off JFET may be obtained by choosing a channel width d in a range from about 200 nm to about 1 μm. Likewise, a normally-on JFET may be obtained by choosing a higher doping concentration and/or a higher channel width d.

For a normally-off JFET the geometry and doping of the semiconductor regions 1, 2, 2a are in one embodiment chosen such that a space charge region extends at least between the body region 2a and an adjacent gate region 2 when substantially the same voltage is applied to the source metallization 8 and the gate metallization 10. Such a current-preventing contiguous space charge region may be represented by the dashed-dotted lines in the first semiconductor region 1 of FIG. 1. For sake of clarity, the corresponding adjoining portions of the space charge regions in the body region 2a and the gate regions 2 are not shown in FIG. 1.

Different thereto and illustrated by the dashed lines in FIG. 1, the space charge regions may extend only slightly across the pn-junctions 11, 13 for a normally-on JFET 100 when substantially the same voltage is applied to the source metallization 8 and the gate metallization 10. Only if a voltage difference higher than the pinch-off voltage is applied between the gate metallization 10 and the source metallization 8, the ohmic current path between the source metallization 8 and the drain metallization 10 becomes high ohmic and broken, respectively.

The doping concentration of the first semiconductor region 1 is typically chosen such that the space charge region does not reach the source metallization 8.

As illustrated in FIG. 1, the body region 2a is typically substantially centered with respect to the adjacent gate regions 2 when seen from above. This may be achieved by self-adjusted manufacturing of the body region(s) 2a and gate regions 2 with low process variations and typically results in symmetric pinch-off behavior and current distribution of the JFET-cells.

As is explained in detail below with regard to FIG. 8A to FIG. 9C, the JFET structure 100 may efficiently be manufactured with low process variations, in particular regarding the channel width d, and thus with an improved trade-off between processing yield and variability of the pinch-off voltage for normally-on structures and improved trade-off between processing yield and variability of the threshold voltage for normally-off structures.

Figure 2:
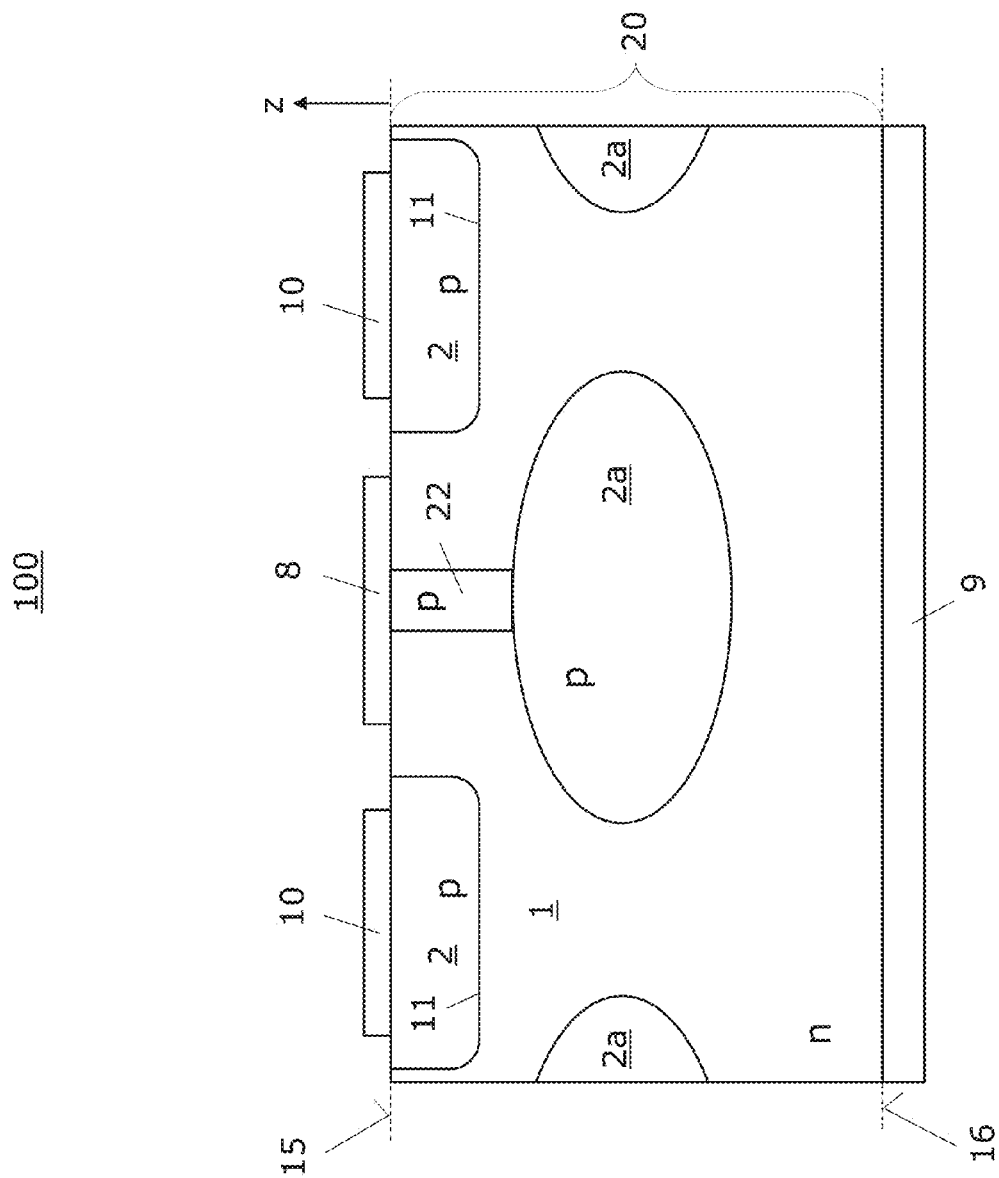
FIG. 2 illustrates a further cross-section through the semiconductor body illustrated in FIG. 1 according to an embodiment.

FIG. 2 illustrates a further vertical cross-section through the JFET 100. The further vertical cross-section is typically parallel to the vertical cross-section of FIG. 1. Note that the horizontal extension of the section illustrated in FIG. 2 is larger compared to FIG. 1. Accordingly, three body regions 2a are shown in FIG. 2.

In the exemplary embodiment shown in FIG. 2, a sufficiently highly doped p-type semiconductor region 22 forming a conductive plug (or short) 22 extends from the source metallization 8 to the central body region 2a for providing an Ohmic contact between the source metallization 8 and the central body region 2a.

Likewise, the left body region 2a and right body region 2a are typically also contacted with the source metallization 8 via respective conductive plugs 22, either in the illustrated vertical cross-section or another vertical cross-section.

Figure 3:
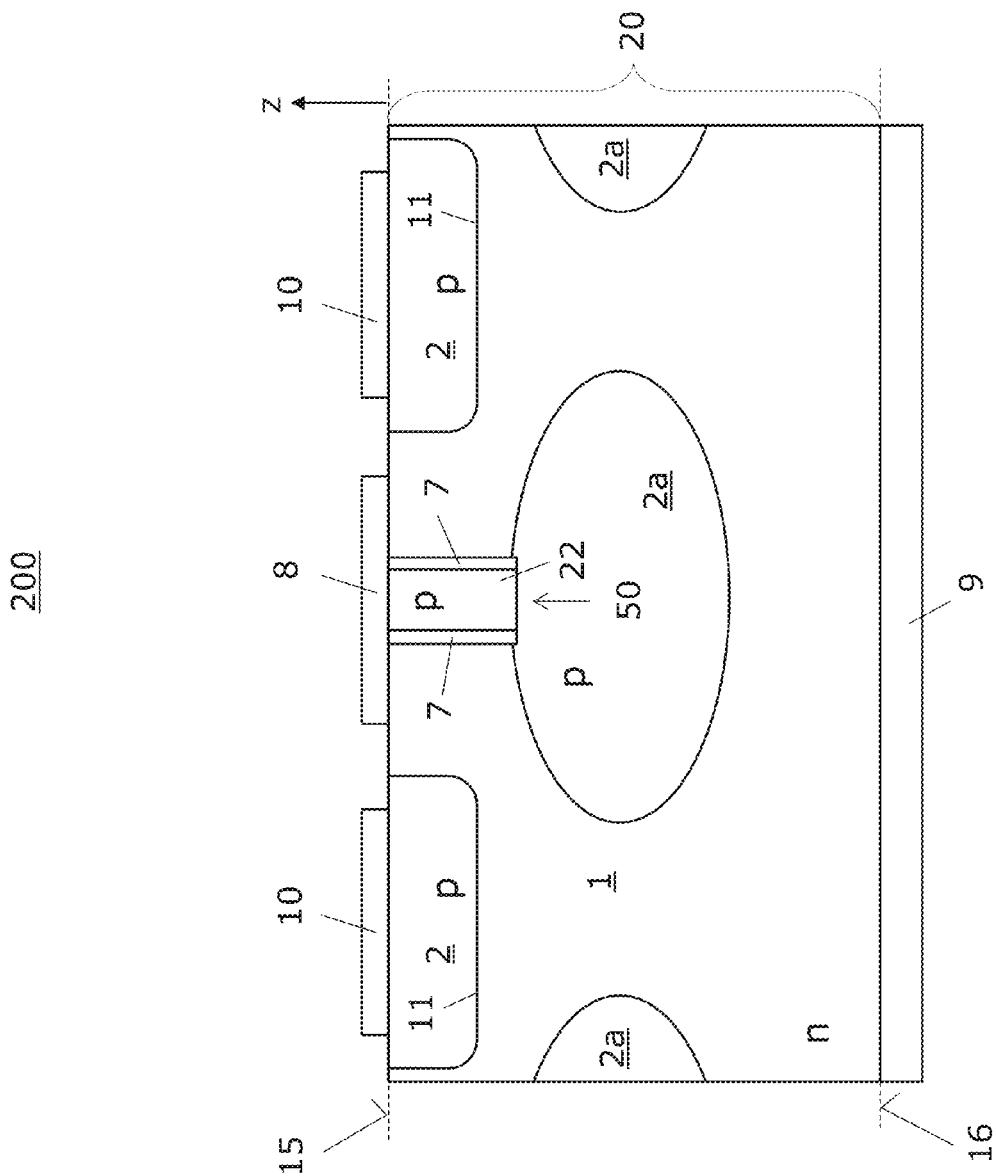
FIG. 3 illustrates a cross-section through a semiconductor body of a vertical semiconductor device according to an embodiment.

In embodiments in which the body regions 2a and the gate regions 2 are shaped as narrow elongated bands, for example rectangles, when seen from above and extend in a direction perpendicular to the vertical cross-section shown in FIG. 3, several spaced apart conductive plugs 22 may be used to contact each body region 2a. Each of the conductive plugs 22 may have a small area of for example less than 20% or 10%, more typically less than 5% or even 1%, compared to the body region(s) 2a and gate regions 2, respectively, when seen from above. Accordingly, low ohmic contact may be provided with at most only slightly influencing the punch-though behavior and/or the pinch-off characteristics of the JFET 100. Furthermore, several conductive plugs 22 per body region 2a may reduce the charging time/discharging time which is of particular importance for fast applications.

FIG. 3 illustrates a vertical cross-section through a vertical semiconductor device 200. The semiconductor device 200 is similar to the semiconductor device 100 explained above with regard to FIG. 1 and FIG. 2 and may also be operated as a JFET. However, the conductive plug 22 is arranged in a trench 50 extending from the first surface 15 to the central body region 2a.

As illustrated in FIG. 3, dielectric region(s) 7 which may, for example, be made of silicon oxide or silicon nitride are formed at the sidewall(s) of the trench 50 and extend from the surface 15 to, more typically partly into the respective body region 2a. Accordingly, the conductive plug 22 is separated from the first semiconductor region 1. This may facilitate manufacturing as the material of the conductive plug 22 may differ from the semiconductor material of the semiconductor body 20. For example, the conductive plug 22 may be made of doped poly-Si or a metal while the first semiconductor region 1, the gate regions 2 and the body region(s) 2a may be made of doped SiC or another wide band-gap material. Further, separating the conductive plug(s) 22 from the first semiconductor region 1, i.e. contacting the body region(s) via laterally insulated trench contacts, ensures that the punch-though behavior and/or the pinch-off characteristics of the JFET 200 is substantially not or at least only slightly influenced by the conductive plug(s) 22. This is due to the substantially reduced capacitance of the dielectrically conductive plug(s) 22 compared to plug(s) forming a pn-junction with the first semiconductor region 1.

Figure 4:
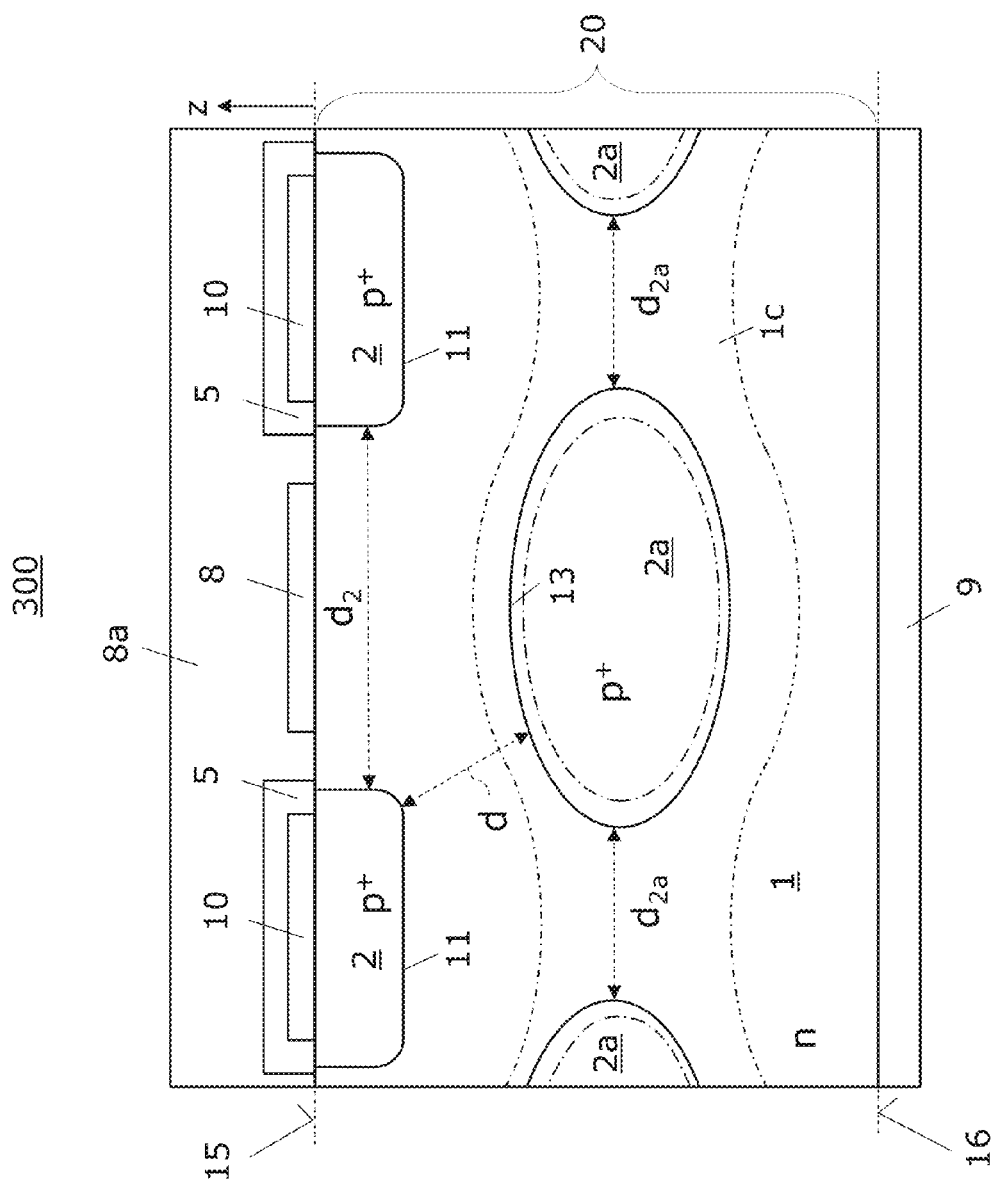
FIG. 4 illustrates a cross-section through a semiconductor body of a vertical semiconductor device according to an embodiment.

With regard to FIG. 4 illustrating a vertical cross-section of a vertical semiconductor device 300, further embodiments are explained. The semiconductor device 300 is similar to the semiconductor devices 100, 200 explained above with regard to FIG. 1 to FIG. 3 and may also be operated as a JFET. In addition, a source power metallization 8a adjoining the source metallization 8 is arranged on the first surface 15 and separated from the gate metallization 10 by an interlayer dielectric 5. Further, a second gate metallization (not shown) adjoining the gate metallization 10 and separated from the source power metallization 8a is typically provided on the first surface 15. This typically reduces ohmic resistance of the wiring (terminals).

For example, p-doped SiC gate regions 2 may adjoin a thin NiAl-alloy gate metallization 10 in contact with a low resistive second gate metallization made of Cu, Al, Mo, for example via optional barrier layers. Likewise, an n-doped SiC first semiconductor region 1 may adjoin a thin TiN source metallization 8 in contact with a low resistive source power metallization made of Cu, Al, Mo, for example via optional barrier layers. In embodiments, in which the conductive plug (not shown) is made of or at least includes p-doped SiC, the source metallization 8 may also have an adjoining Nia-alloy-portion. Furthermore, the drain metallization 9 may be formed as a layered metallization including a thin TiN-layer, a power layer of Cu, Al, Mo and optional barrier layers therebetween.

Depending on the doping relations of the semiconductor regions 1, 2, 2a and the geometry of the semiconductor regions 1, 2, 2a, in particular the distance $d_2$ between adjacent gate regions 2, the distance $d_{2s}$ between adjacent body regions 2a, and the distance between adjacent gate and body regions 2, 2a, the current-preventing (current-blocking) space charge region may be formed and controlled, respectively, between adjacent gate regions 2 (and partly in the gate regions 2), adjacent body regions 2a (and partly in the body regions 2) and/or between adjacent gate and body regions 2, 2a (and partly in gate and body regions 2, 2a).

For example, the geometry and doping of the semiconductor regions 1, 2, 2a are in one embodiment of a normally-on JFET chosen such that a current-preventing, contiguous lower space charge region 1c (typically extending between opposite lateral edges of the semiconductor body 20 each of which extends between the surfaces 15, 16) is, at the pinch-off voltage, first formed by joining lower space charge portions at the body regions 2a. For sake of clarity, the still separated upper space charge portions formed at the first pn-junction 11 are not illustrated in FIG. 4. In this example, the upper space charge portions are typically joined with each other and/or the lower space charge region 1c at voltages higher than the pinch-off voltage.

Likewise, the geometry and the doping of the semiconductor regions 1, 2, 2a may be chosen such that the current-preventing, contiguous lower space charge region 1c of a normally-off JFET is, at the threshold voltage, opened (disrupted when seen from above and/or divided into non-contiguous portions in the cross-sectional view) when the upper space charge regions is already opened.

According to an embodiment of a normally-on JFET, the geometry and the doping of the semiconductor regions 1, 2, 2a are chosen such that a current-blocking lower space charge region 1c is expected to extend at least between adjacent body regions 2a (and to include the second pn-junctions 13 as illustrated in FIG. 4) and that a current-blocking upper space charge region vertically spaced apart from the current-blocking lower space charge region 1c is expected to extend between adjacent gate regions 2 (and to include the first pn-junctions 11) when substantially the same pinch-off voltage is applied to the source metallization 8 and the gate metallization 10.

Likewise, the geometry and the doping of the semiconductor regions 1, 2, 2a may, for normally-off JFET, be chosen such that the current-blocking lower space charge region 1c and the (vertically spaced apart) current-blocking upper space charge region are opened when substantially the same threshold voltage difference is applied between the source metallization 8 and the gate metallization 10.

JFETs which are designed so that a current-blocking lower space charge region and a (vertically spaced apart) current-blocking upper space charge region are formed and opened, respectively, at substantially the same voltage difference (pinch-off voltage for normally-on JFETs and threshold voltage for normally-off JFETs) applied between the source metallization 8 and the gate metallization 10 may also be considered as JFETs having, in the cross-sectional view, spaced apart lower channel portions (between the body regions 2a and the second pn-junctions 13, respectively) and upper channel portions (between the gate regions 2 and the first pn-junctions 11, respectively) which are spaced apart from each other and the lower channel portions and also horizontally off-set with respect to the lower channel portions. The vertically spaced apart channel portions of the first semiconductor region 1 (formed between adjacent body regions 2a and adjacent gate regions 2, respectively) which are off-set in a horizontal direction, result in a JFET-design which is particularly robust with respect to manufacturing variations, e.g. CD-variations.

Figure 5:
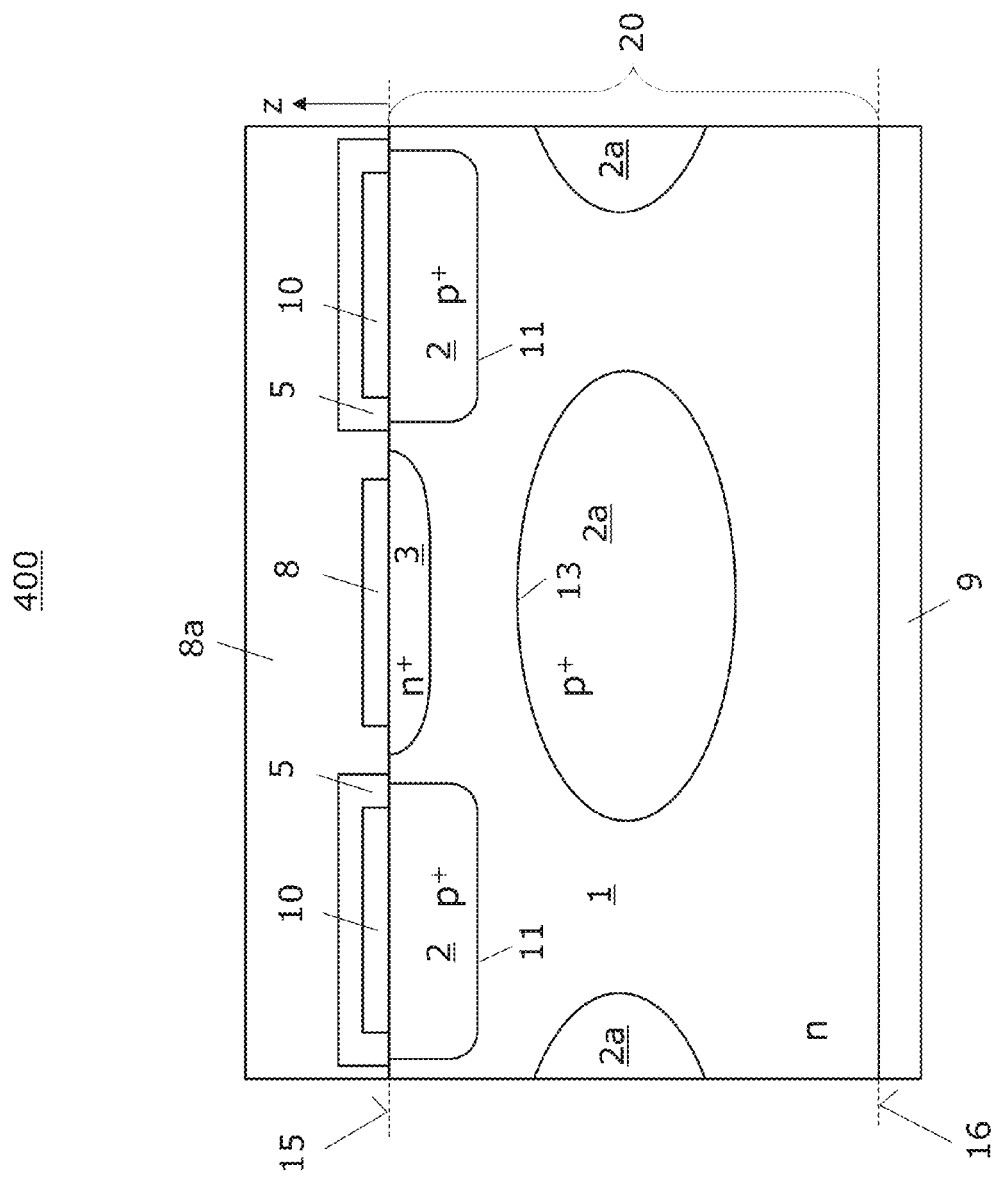
FIG. 5 illustrates a cross-section through a semiconductor body of a vertical semiconductor device according to an embodiment.

FIG. 5 illustrates a vertical cross-section through a vertical semiconductor device 400. The semiconductor device 400 is similar to the semiconductor device 300 explained above with regard to FIG. 4 and may also be operated as a JFET. In addition, n⁺-doped first contact portion 3 of the first semiconductor region 1 adjoins the source metallization 10 for providing an Ohmic contact.

Figure 6:
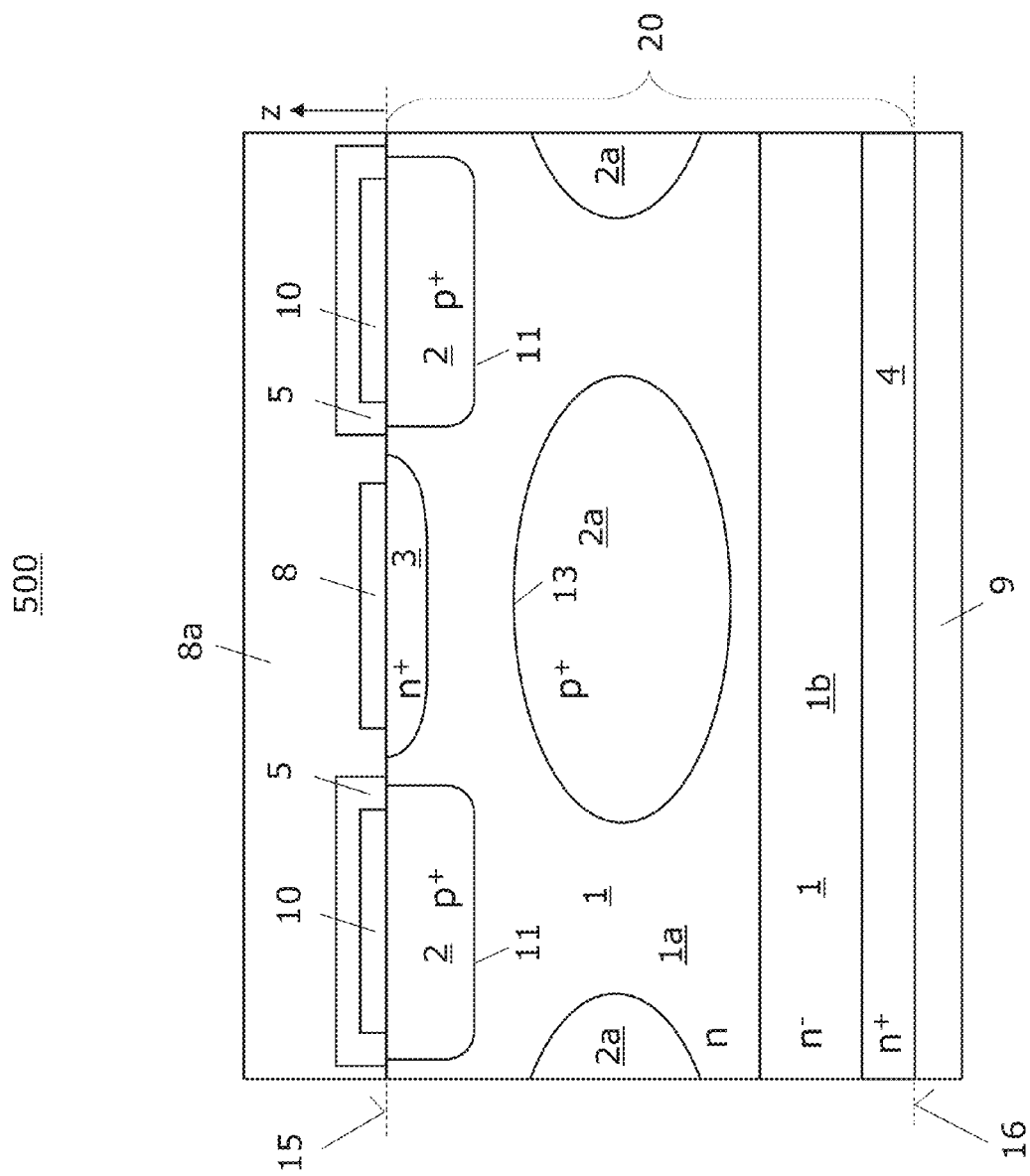
FIG. 6 illustrates a cross-section through a semiconductor body of a vertical semiconductor device according to an embodiment.

FIG. 6 illustrates a vertical cross-section through a vertical semiconductor device 500. The semiconductor device 500 is similar to the semiconductor devices 300, 400 explained above with regard to FIG. 4 and FIG. 5, and may also be operated as a JFET.

In the exemplary embodiment illustrated in FIG. 6, the first semiconductor region 1 includes an n-doped current-spread portion 1a forming the first and second pn-junctions 11 and 13 with the gate regions 2 and the body region(s) 2a, respectively, and an adjoining lower n-doped drift portion arranged below the current-spread portion 1a. Typically, the current-spread portion 1a extends, in vertical direction, at least to the body regions 2a and facilitates distributing the current in the drift portion 1b.

An n-doped first contact portion 3 (source contact region) having a higher maximum doping concentration than the current-spread portion may be arranged between the adjacent p-doped gate regions 2 and between the adjoining current-spread portion 1a and the source metallization 8.

Further, an n-doped second contact portion 4 (drain contact) having a higher maximum doping concentration than the drift portion 1b and in ohmic contact with the adjoining drain metallization 9 may be arranged between the drain metallization 9 and the adjoining drift portion 1a and the current-spread portion 1a, respectively. In addition, a buffer layer (not shown) may be arranged between the drift portion 1b and the second contact portion 4. The buffer layer has typically a maximum doping concentration higher than the drift portion 1b and a lower than the contact portion 4, for example in a range from about $10^{18}$ cm$^{-3}$ to about $5*10^{18}$ cm$^{-3}$. The vertical extension of the buffer layer may be in a range from about 0.5 μm to about 1 μm.

With regard to FIG. 7A and FIG. 7B, further embodiments are explained. FIG. 7A illustrates an upper vertical section through a unit cell of vertical power semiconductor device 600. The semiconductor device 600 is similar to the semiconductor device 500 explained above with regard to FIG. 6 and may also be operated as a JFET. In addition, typical doping profiles are illustrated in FIG. 6. The first contact region 3 may substantially extend to the gate region(s) 2. Manufacturing of such a semiconductor structure may be facilitated by using a common mask for donor and acceptor implantations for the source contact region(s) 3 and the body region(s) 2a.

FIG. 7B illustrates a perspective view of a part of the vertical semiconductor 600. The unit cell illustrated in FIG. 7A may correspond to a section of the vertical plane s in FIG. 7B. As shown in FIG. 7B, the p-doped body region 2a is typically in ohmic contact with the source metallization 10 via a typically highly p-type semiconductor region 22 forming a conductive connection or plug.

As explained above, the conductive plug(s) 22 is typically only formed in one or more a comparatively small connection areas, when seen from above. Typically, a maximum horizontal extension of the conductive plug(s) 22 is at least three times smaller, more typically at least ten times smaller, and even more typically at least 25 times smaller than a maximum horizontal extension of the body region 2a and/or a maximum horizontal extension of the source semiconductor region 2. For example, the first contact portion 3, the body region 2a and the source region 2 are shaped as elongated bars or stripes, when seen from above, and the conductive plug(s) 22 is shaped as a circle or a compact polygon such as a regular hexagon when seen from above. In this embodiment, such a compact conductive plug(s) 22 may be arranged between each of two respective end portions of the body region 2a and the gate region 2 next to a peripheral area and an edge of the semiconductor body 20, respectively. In embodiments in which several compact conductive plugs 22 per body region 2a are used, the sum of the maximum horizontal extensions of the several compact conductive plugs 22 is typically at least three times smaller, more typically at least ten times smaller than the maximum horizontal extension of the body region 2a and/or the maximum horizontal extension of the gate region 2.

Typically, the conductive plug(s) 22 are separated from the drift portion 1b and the current-spread portion 1a by dielectric regions (not shown). Numerical simulations show, that the current-voltage characteristics are almost not influenced by the CD-variations of the manufacturing explained below. Further, the avalanche generation during the blocking mode of the JFET always started next to the body region 2a. Accordingly, a high avalanche stability of the JFET is to be expected.

With regard to FIG. 8A to FIG. 9C, method steps of a method for forming a semiconductor device 700, which is similar to the semiconductor devices explained above with regard to FIG. 1 to FIG. 7B, are illustrated in respective vertical cross-sections through a semiconductor body 20 which is typically a semiconductor wafer. For sake of clarity, each of the figures illustrates only one unit cell 101 of one of a plurality of a semiconductor devices 700 which are typically manufactured in parallel on wafer-level.

In a first step, a wafer 20, for example a SiC-wafer, extending between a first surface 15 and a second surface 16 arranged opposite to the first surface 15 is provided. The wafer 20 may include a highly n-doped substrate 4 extending to the back surface 16 and one or more n-type epitaxial layers forming a first n-type semiconductor layer 1 on the substrate 4 and extending to the first surface 15. In the semiconductor device 700 to be manufactured, the substrate 4 and portions thereof, respectively, typically forms a drain contact layer or drain contact portion 4.

Thereafter, a hard mask 7, for example a silicon nitride mask or a silicon oxide mask, may be formed on the first surface 15. The hard mask 7 includes openings which defines first zones 2 in the n-doped first semiconductor layer 1.

Thereafter, acceptor ions of a first maximum energy may be implanted through the hard mask 7 into the first zones 2. This may include several first acceptor implantations with different energies. The resulting semiconductor structure 700 is illustrated in FIG. 8A.

Figure 8C:
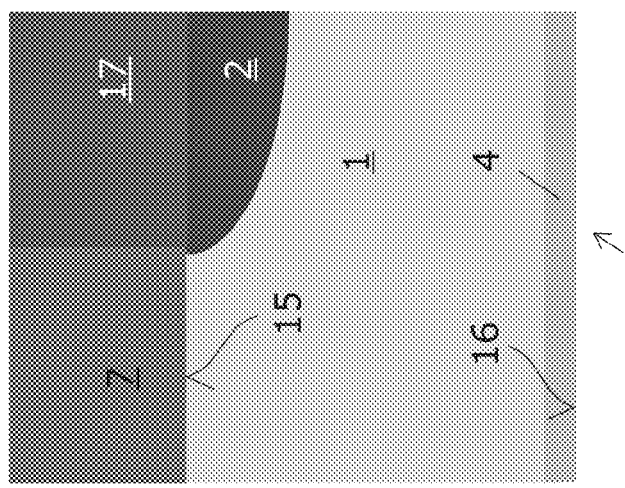
FIG. 8A to FIG. 9C illustrates vertical cross-sections through a semiconductor body during method steps of a method according to embodiments.
Figure 8B:
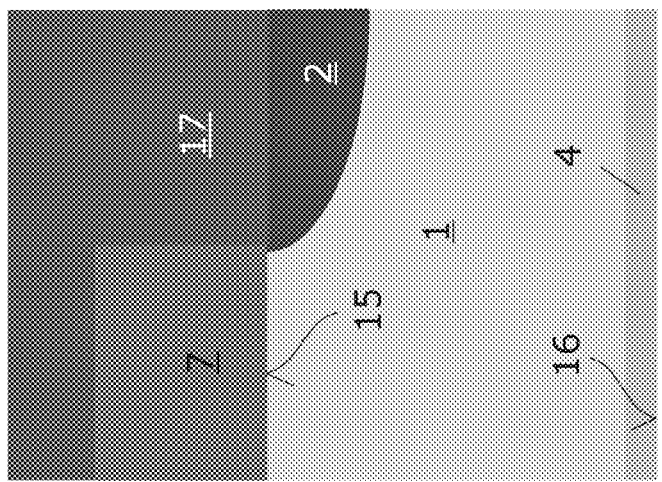
Figure 8A:
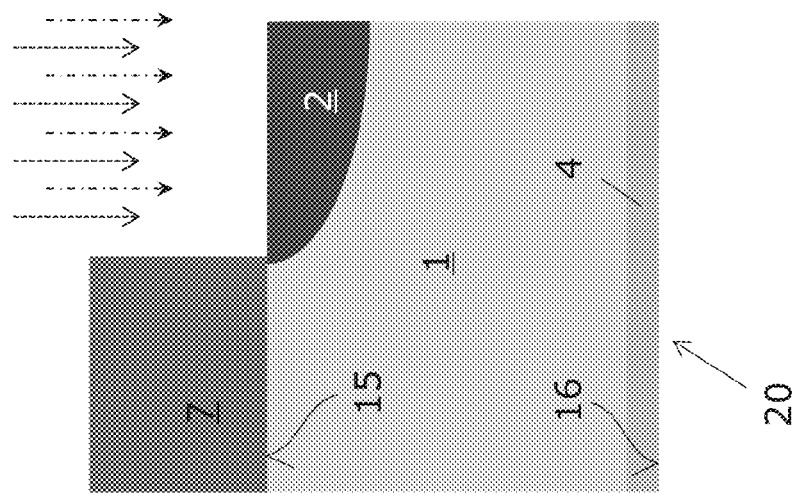

In exemplary embodiment shown in FIG. 8A, the one or more first acceptor implantations (represented by the dashed arrows) are performed such that a high acceptor dose is implanted close to the first surface 15.

As indicated by the dashed-dotted arrows in FIG. 8A, donor ions may be implanted through the hard mask 7 into lower zones of the first semiconductor layer 1 below the first zones 2. After a later thermal activating, the implanted donor ions may contribute to the increased conductivity of a current-spread portion.

Thereafter, the hard mask 7 is replaced by an inverted mask 17 having openings which are substantially complementary to the openings of the hard mask 7. This is typically done in a self-aligned manner.

Typically, replacing the hard mask 7 includes forming a mask layer 17 on the hard mask 7. The resulting semiconductor structure 700 is illustrated in FIG. 8B.

Forming the mask layer 17 may include depositing of poly-silicon, diamond-like carbon (DLC) or a resin on the first surface 15 and the hard mask 7, respectively. Typically, the material of the mask layer 17 is selectively etchable with respect to the material of the hard mask 7 and the material of the wafer 20.

In one embodiment, the hard mask 7 is partly etched back selectively to the semiconductor material of the wafer 20 to thin the hard mask 7 prior to forming the mask layer 17. This facilitates later forming equally spaced p-doped gate regions 2 and p-doped body regions 2a in the first semiconductor layer 1 as the gate regions 2 and the body regions 2a are to be formed in different depth using different maximum implanting energies. For example, the hard mask 7 may be partly back-etched between two of the first acceptor implantations.

Furthermore, the openings of the hard mask 7 may be widened, for example by etching, prior to forming the mask layer 17. Accordingly, the overlap, in projection onto the first surface 15, of the later formed gate regions 2 and body regions 2a may be increased.

Alternatively, the width of the openings of the hard mask 7 may be reduced prior to forming the mask layer 17. Accordingly, the overlap, in projection onto the first surface 15, of the later formed gate regions 2 and the body regions 2a may be reduced. Reducing the width of the openings of the hard mask 7 may be achieved by an isotropic deposition of hard mask material with a first height and subsequent anisotropic back-etching of the deposited hard mask material by the first height.

Thereafter, the mask layer 17 may be thinned using the hard mask 7 as a stop region. Typically, this includes a CMP-process (Chemical Mechanical Polishing/Planarization). The resulting semiconductor structure 700 is illustrated in FIG. 8C. Alternatively, a deposition-etch-deposition process sequence and a further dry-chemical etching may be used to form a plane mask surface.

Figure 9C:
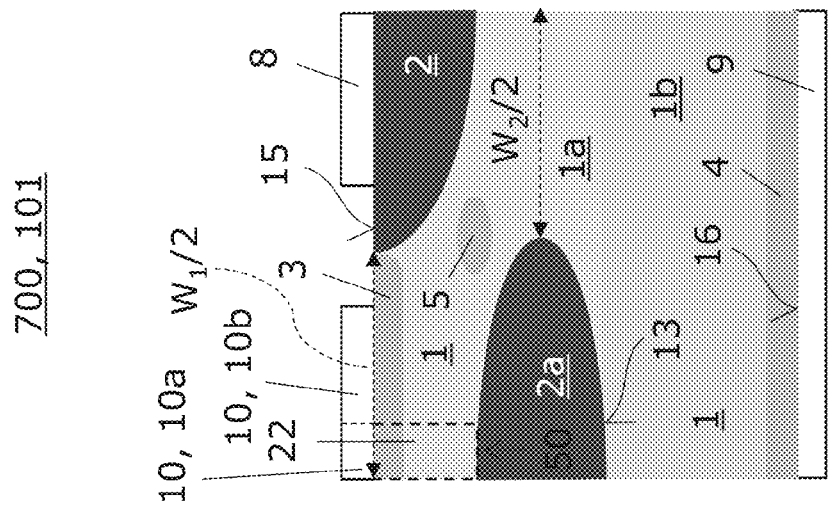
Figure 9B:
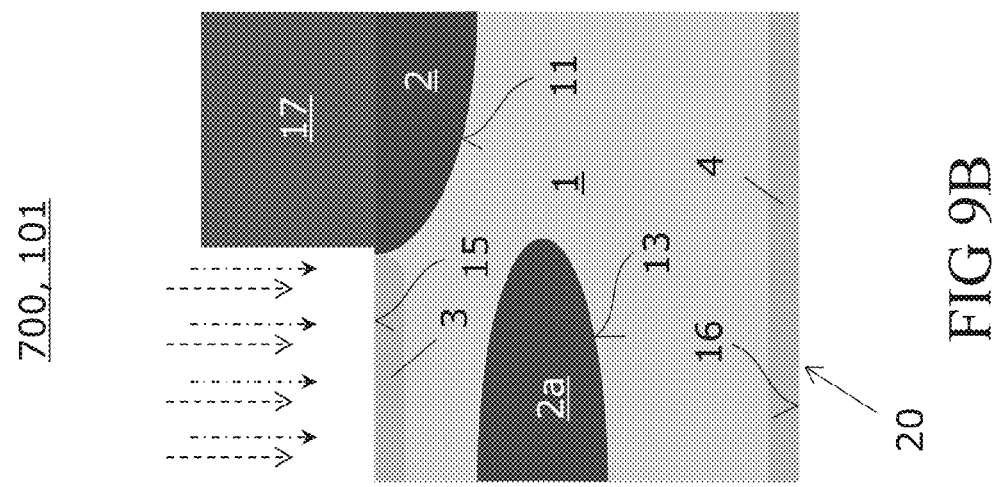
Figure 9A:
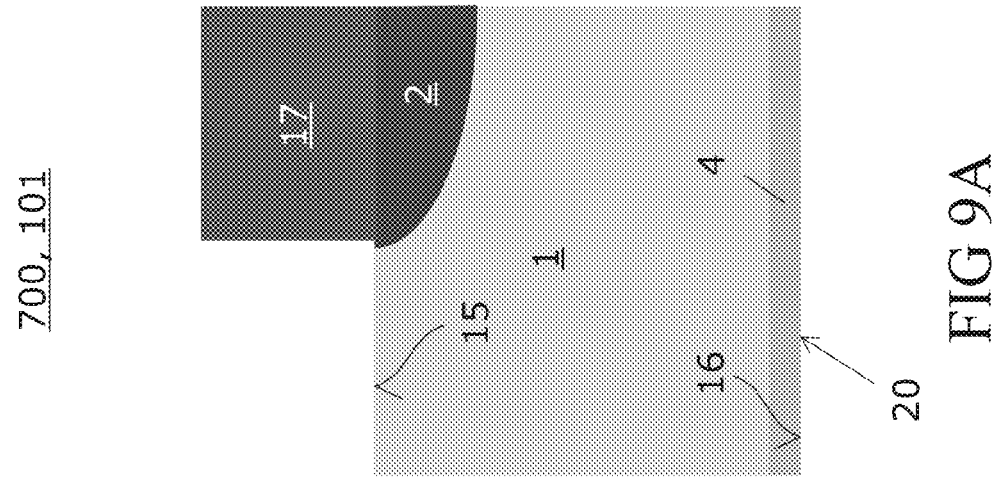

Thereafter, the hard mask 7 may be removed from the first surface 15, for example by selective etching, to form the inverted mask 17 as illustrated in FIG. 9A.

As indicated by the dashed arrows in FIG. 9B, acceptor ions of a second maximum energy which is different to, and in the case of the exemplary process sequence, higher than, the first maximum energy are implanted through the inverted mask 17 into second zones 2a of the n-doped first semiconductor layer 1. This may include several second acceptor implantations with different energies.

In the exemplary embodiment shown in FIG. 9B, the minimum energy of the second acceptor implantations is higher than the minimum energy of the first acceptor implantations, and the maximum energy of the second acceptor implantations is higher than the maximum energy of the first acceptor implantations. Accordingly, the acceptor ions are in the second acceptor implantations mainly implanted in second zones 2a which are spaced apart the first surface 15 and extend vertically deeper into the wafer 20 than the first zones 2. The minimum energy of the second acceptor implantations may even be higher than the maximum energy of the first acceptor implantations.

As indicated by the dashed-dotted arrows in FIG. 9B, donor ions may be implanted through the inverted mask 17 into upper zones of the first semiconductor layer 1 above the second zones 2a and with a higher dose into third zones 3 of the first semiconductor layer 1 arranged above the second zones 2a and at or at least next to the first surface 15. After a later thermal activating, the implanted donor ions may contribute to the increased conductivity of a current-spread portion and a contact portion 3, respectively.

Thereafter, the inverted mask 17 may be removed, for example by etching.

Thereafter, acceptor ions of a third maximum energy higher than the first maximum energy and lower than the second maximum energy may be implanted into fourth zones 22 of the first semiconductor layer 1 arranged between adjacent first zones 2 and between the second zones 2a and the first surface 15. This is typically done by masked implantation using a further mask (not shown) having openings which are smaller than the first openings and are arranged within the first zones 2a when seen from above. Typically, the openings of the further mask are substantially centered with regard to the first zones 2a and first openings, respectively, when seen from above. After a later thermal activating, the implanted acceptor ions of the third maximum energy may form a p-type connection 22 between the first zones (gate regions) 2 and the second zones (body regions) 2a.

Furthermore, additional donor ions may be implanted into fifth zones 5 of the first semiconductor layer 1 arranged between the first zones 2 and the second zones 2a of the first semiconductor layer 1. This is typically done by masked implantation using an additional mask (not shown). After a later thermal activating, the implanted donor ions may compensate acceptor ions implanted into or in-diffusing during the later thermal activating into the designed n-channel portions between the first zones 2 and the second zones 2a.

Further donor ions may be mask-less implanted into one or more horizontal layers, for example between the first zones 2 and the second zones 2a, and/or below the second zones 2a. After a later thermal activating, the further donor ions may contribute to the increased conductivity of the current-spread portion. In one embodiment, the dopants for the current-spread portion are implanted by mask-less implantation only.

Thereafter, a high-temperature step may be carried out to activate the acceptor ions in the first zones 2, the second zones 2a and the fourth zones 22. Accordingly, spaced apart p-doped gate regions 2 substantially extending to the first surface 15 and p-doped body regions 2a, which are, in the vertical cross-section, spaced apart from one another, from the p-doped gate regions 2, from the first surface 15 and from the second surface 16, are formed in the first semiconductor layer 1 in a self-adjusted manner.

Therefore, process variations are less important. In particular, a variation of the width of the openings in the hard mask (7) is compensated by a complementary variation width of the openings in the inverted mask (17). Accordingly, the sum of the first minimum distance $w_1$ between adjacent p-doped gate regions 2 and the second minimum distance $w_2$ between adjacent p-doped body regions 2a is substantially not altered by variation of the width of the openings in the hard mask, and thus for a given mask design substantially constant.

In the high-temperature step, the optionally implanted donor ions may also be activated to form a higher n-doped current-spread portion 1a and/or an n-doped first contact portion 3 in the first semiconductor layer 1. It is, however, also possible to use several high-temperature steps to activate dopants prior to further implantations.

Thereafter, a gate metallization 8 in ohmic contact with the gate regions 2 and a source metallization 10 in ohmic contact with the source region(s) 3 and the body region(s) 2a may be formed on the first surface 15, typically at the first surface 15.

The gate metallization 8 may be formed by depositing and structuring a conductive material forming an Ohmic contact with the semiconductor material of the gate regions 2 such as a NiAl-alloy for p-type SiC. In one embodiment, portions of the deposited conductive material 10b may be used to provide an Ohmic contact with the semiconductor material of the adjoining p-type conductive regions 22.

The source metallization 10 (or second portions 10b thereof) may be formed by depositing and structuring a conductive material forming an Ohmic contact with the semiconductor material of the source contact regions 3 such as TiN for n-type SiC.

Thereafter, a drain metallization 9 in ohmic contact with the first semiconductor layer 1 may be formed on the second surface 16. The resulting JFET 700 is illustrated in FIG. 9C.

An interlayer dielectric (not shown) and a source power metallization of Cu, Al, Mo or a low resistivity alloy may be formed on the first surface 15 and in contact with the source metallization 10, for example via optionally formed barrier layers. Further, a drain power metallization of Cu, Al, Mo or a low resistivity alloy may be formed on the second surface 16 and in contact with the drain metallization 9, for example via optionally formed barrier layers.

Instead of forming one or more p-type conductive regions 22 per body region 2a for contacting the body regions 2a by implantation, each of the body regions 2a may be contacted with the source metallization 10 via one or more laterally insulated trench contacts.

Forming the laterally insulated trench contact(s) typically includes etching a respective trench 50 from the first surface 15 close to, to or more typically into the first zone 22, forming a dielectric regions on the sidewalls of the trench 50, for example by deposition or thermal oxidation and subsequent anisotropic etching to remove the dielectric material from the trench bottom, and filling the trench 50 with a conductive material such as doped poly-Si or the like. In this embodiment, the source metallization 10 may be formed by a contiguous material.

Due to the self-aligned forming of the gate and body regions 2, 2a using a mask and an inverted mask and substantially defining the vertical extensions of the semiconductor regions by implantations, the methods explained above with regard to FIG. 8A to 9C allow for reliable manufacturing of normally-on and normally-off JFETs, in particular SiC-JFETs, with low on-state resistance or comparatively low forward-voltage drop, low leakage current, and high avalanche- and surge current stability.

The method is typically performed such that, in a sectional plane substantially perpendicular to the first surface 15, a plurality of spaced apart p-doped gate regions 2 in ohmic contact with the gate metallization 8 are formed which form respective first pn-junctions 11 with the first semiconductor layer 1 and substantially extend to the first surface 15, and that in the sectional plane, a plurality of body regions 2a forming second pn-junctions 13 with the n-doped first semiconductor layer 1 are formed which are spaced apart from the first pn-junctions 11 so that, in a projection onto the first surface 15, at least a portion of each of second pn-junctions 13 is arranged between a pair of adjacent first pn-junctions 11. In the projection onto the first surface 15, the second pn-junctions 13 may extend and partly overlap with the adjacent first pn-junctions 11.

Figure 10A:
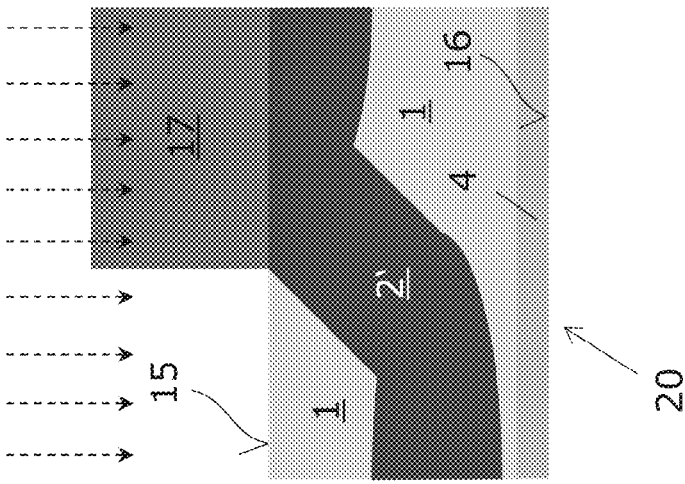
FIG. 10A to FIG. 10C illustrates vertical cross-sections through a semiconductor body during method steps of a method according to embodiments.
Figure 10B:
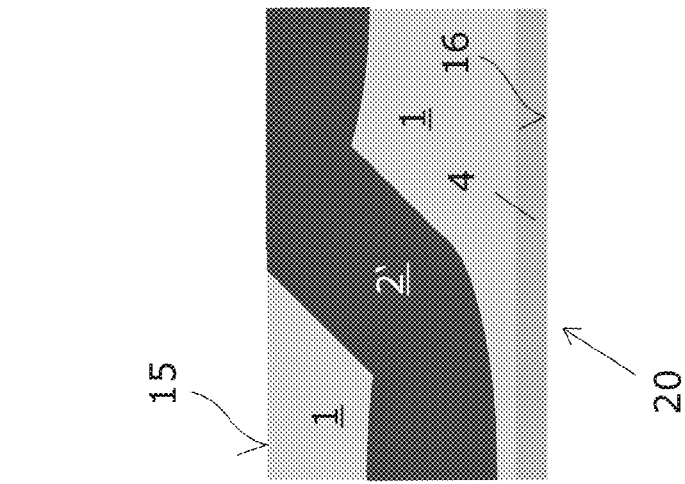
Figure 10C:
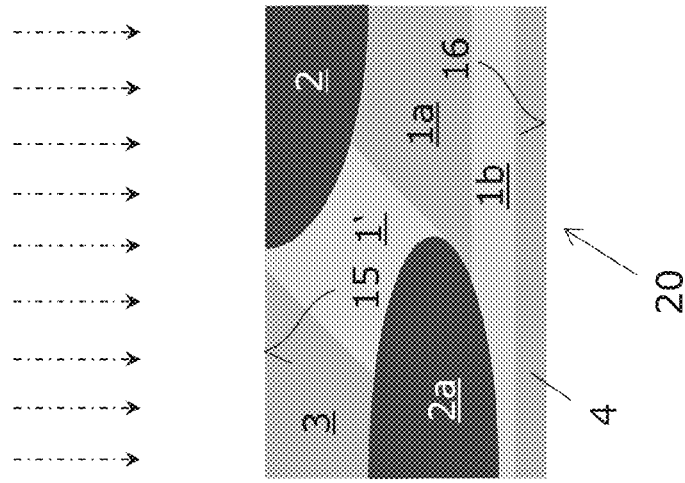

With regard to FIG. 10A to FIG. 10C, method steps of a method for forming a semiconductor device 800, which is similar to the semiconductor devices explained above with regard to FIG. 1 to FIG. 7B, are illustrated in respective vertical cross-sections through a semiconductor body 20 which is typically a semiconductor wafer. For sake of clarity, each of the figures illustrates only one unit cell 101 of one of a plurality of a semiconductor devices 800 which are typically manufactured in parallel on wafer-level.

In a first step, a wafer 20, for example a SiC-wafer, extending between a first surface 15 or first side and a second surface 16 or second side arranged opposite to the first surface 15 is provided. The wafer 20 may include a highly n-doped substrate 4 extending to the second side 16 and one or more n-type epitaxial layers forming a first n-type semiconductor layer 1 on the substrate 4 and extending to the first side 15. In the semiconductor device 800 to be manufactured, the substrate 4 and portions thereof, respectively, typically forms a drain contact layer or a drain contact portion 4.

Thereafter, a mask 17 may be formed on the first side 17. In the sectional plane shown in FIG. 10A, only one mask portion 17 and one opening of typically a plurality of mask portions 17 alternating with respective openings are shown. The mask 17 may be a silicon nitride mask or a silicon oxide mask or a resist mask or a polysilicon mask.

Thereafter, acceptor ions may be implanted through the mask 17 into the first semiconductor layer 1. As illustrated in FIG. 10A, the acceptor ions have first maximum energy (first energy distribution) so that also the acceptor ions impacting on (reaching) the mask portions 17 can penetrate through the mask portions 17 and are implanted into the first semiconductor layer 1 next to the first side 15. Acceptor ions penetrating the mask portions 17 are, due to the loss of energy, implanted less deep into the first semiconductor layer 1 than acceptor ions reaching the first semiconductor layer 1 through the mask openings. Due to edge effects, acceptor ions are (to a lesser extend) also implanted into intermediate depths. Thus a substantially contiguous zone 2' having an excess of acceptor ions may be formed in the first semiconductor layer 1. The substantially contiguous zone 2' has typically upper portions next to the first side 15 (next to the mask portions) and lower portions spaced apart from the first side 15 (below the openings).

Typically, the acceptor ions have first maximum energy in a range from about 500 keV to about 2 MeV for a silicon oxide mask with a vertical extension in a range from about 0.3 μm to about 2 μm.

Further, several acceptor implantations with different maximum ion energies may be used.

Thereafter, the mask 17 may be removed. The resulting semiconductor structure is illustrated in FIG. 10B.

Thereafter, donor ions may be implanted from the first side 15 into the first semiconductor layer 1. This may even be done using a mask-less implantation or substantially mask-less implantation, i.e. without covering the active or cell area at the first side 15 of the semiconductor device to be manufactured, as illustrated in FIG. 10C.

Typically, the donor ions are implanted such that the substantially contiguous zone 2' is, in the sectional plane, separated into upper zones 2 and lower zones 2a spaced apart from each other and the upper zones. The upper zones 2 are arranged next to the first side 15, spaced apart from each other and typically form gate regions 2 in the semiconductor device to be manufactured. The lower zones 2a typically form body regions 2a in the semiconductor device to be manufactured.

Typically, the donor ions have first maximum energy in a range from about 250 keV to about 1.5 MeV.

The order of implanting acceptor ions and donor ions may also be reversed.

Thereafter, similar processes as explained above with regard to FIG. 9C for forming conductive plugs (22) that may be separated by dielectric region(s) from the first semiconductor region 1, a gate metallization (8), a source metallization (10), and a drain metallization (9) are typically carried out to form a three-terminal vertical JFET 800. For the process sequences described with regard to FIG. 10A to FIG. 10C the overall mask effort is reduced.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific FIG. may be combined with features of other Figures, even in those cases in which this has not explicitly been mentioned. Such modifications to the inventive concept are intended to be covered by the appended claims.

Spatially relative terms such as "under," "below," "lower," "over," "upper" and the like are used for ease of description to explain the positioning of one element relative to a second element. These terms are intended to encompass different orientations of the device in addition to different orientations than those depicted in the Figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A vertical JFET, comprising:
   a semiconductor body having a first surface and a second surface that runs substantially parallel to the first surface;
   a source metallization arranged on the first surface;
   a drain metallization arranged on the second surface; and
   a gate metallization arranged on the first surface, wherein, in a sectional plane substantially perpendicular to the first surface, the semiconductor body comprises:
   an n-doped first semiconductor region in ohmic contact with the drain metallization and the source metallization;
   a plurality of p-doped second semiconductor regions in ohmic contact with the gate metallization, substantially extending to the first surface, spaced apart from one another and forming respective first pn-junctions with the first semiconductor region; and
   a plurality of p-doped body regions in ohmic contact with the source metallization, spaced apart from one another, from the p-doped second semiconductor regions, from the first surface and from the second surface, and forming respective second pn-junctions with the first semiconductor region,
   wherein the semiconductor body further comprises at least one conductive plug extending from the source metallization to one of the body regions.

2. The vertical JFET of claim 1, wherein at least one current path runs in the semiconductor body from the drain metallization to the source metallization only through n-doped semiconductor regions.

3. The vertical JFET of claim 1, wherein a space charge region extends at least between at least one of the body regions and an adjacent second semiconductor region, and/or at least between at least two of the body regions, and/or at least between at least two of the second semiconductor regions when a voltage difference higher than a pinch-off voltage is applied between the source metallization and the gate metallization; or wherein a space charge region extends at least between at least one of the body regions and an adjacent second semiconductor region, and/or at least between at least two of the body regions, and/or at least between at least two of the second semiconductor regions when the gate metallization and the source metallization are substantially on the same potential.

4. The vertical JFET of claim 1, wherein a lower space charge region and an upper space charge region spaced apart from the lower space charge region are formed when the gate metallization and the source metallization are substantially on the same potential, so that the lower space charge region includes at least two of the second pn-junctions and that the upper space charge region includes at least two of the first pn-junctions.

5. The vertical JFET of claim 1, wherein at least one of the p-doped body regions partly overlaps with two of the second semiconductor regions when seen from above.

6. The vertical JFET of claim 1, wherein the at least one conductive plug is arranged in a trench extending from the first surface to one of the body regions.

7. The vertical JFET of claim 6, further comprising a dielectric region arranged on a sidewall of the trench.

8. The vertical JFET of claim 1, wherein the at least one conductive plug comprises a p-doped semiconductor material.

9. The vertical JFET of claim 1, wherein the semiconductor body is comprised of a semiconductor material that has a band-gap higher than about two electron volts.

10. The vertical JFET of claim 1, wherein the n-doped first semiconductor region comprises at least one of:
    an n-doped current-spread portion forming at least a part of the first pn-junctions and forming at least a part of the second pn-junctions;
    an n-doped drift portion having a lower maximum doping concentration than the current-spread portion, and arranged between the current-spread portion and the drain metallization;
    an n-doped first contact portion having a higher maximum doping concentration than the current-spread portion, arranged between a pair of adjacent p-doped second semiconductor regions, and arranged between the current-spread portion and the source metallization;
    an n-doped embedded portion completely embedded in the current-spread portion, and having a higher maximum doping concentration than the current-spread portion; and
    an n-doped second contact portion having a higher maximum doping concentration than the drift portion and arranged between the drain metallization and at least one of the drift portion and the current-spread portion.

11. A JFET, comprising:
    a semiconductor body comprising a semiconductor material that has a band-gap higher than about two electron volts and extends between a first surface and a second surface which runs substantially parallel to the first surface;
    a source metallization arranged on the first surface;
    a gate metallization arranged on the first surface; and a drain metallization arranged on the second surface, wherein, in a sectional plane substantially perpendicular to the first surface, the semiconductor body comprises:

a first semiconductor region in ohmic contact with the source metallization and the drain metallization;

at least two second semiconductor regions in ohmic contact with the gate metallization, spaced apart from one another, and forming respective first pn-junctions with the first semiconductor region; and at least one body region completely embedded in the first semiconductor region and forming a second pn-junction with the first semiconductor region, wherein the at least one body region is spaced apart from the first surface and from the source metallization, wherein at least a portion of the at least one body region is, in a projection onto the first surface, arranged between the two second semiconductor regions, and wherein the semiconductor body further comprises in the sectional plane a plurality of second semiconductor regions forming a first lattice and a plurality of body regions forming a second lattice.

12. The JFET of claim 11, further comprising at least one of a conductive region forming at least a portion of an ohmic current path between the source metallization and the at least one body region, and a dielectric region separating the conductive region from the first semiconductor region.

13. The JFET of claim 11, wherein the second semiconductor regions substantially extend to the first surface.

14. The JFET of claim 11, wherein at least one ohmic current path runs in the semiconductor body from the source metallization to the drain metallization.

* * * * *